United States Patent
Tatsumi

(10) Patent No.: US 10,879,348 B2
(45) Date of Patent: Dec. 29, 2020

(54) SEMICONDUCTOR DEVICE AND ELECTRONIC APPARATUS

(71) Applicant: SONY SEMICONDUCTOR SOLUTIONS CORPORATION, Kanagawa (JP)

(72) Inventor: Takaaki Tatsumi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/487,974

(22) PCT Filed: Feb. 26, 2018

(86) PCT No.: PCT/JP2018/006877
§ 371 (c)(1),
(2) Date: Aug. 22, 2019

(87) PCT Pub. No.: WO2018/163872
PCT Pub. Date: Sep. 13, 2018

(65) Prior Publication Data
US 2019/0393301 A1    Dec. 26, 2019

(30) Foreign Application Priority Data
Mar. 9, 2017    (JP) ................ 2017-044644

(51) Int. Cl.
*H01L 29/06*    (2006.01)
*H01L 29/40*    (2006.01)

(52) U.S. Cl.
CPC ........ *H01L 29/0619* (2013.01); *H01L 29/405* (2013.01)

(58) Field of Classification Search
CPC ............. H01L 29/0619; H01L 29/0623; H01L 29/402–407
See application file for complete search history.

(56) References Cited

U.S. PATENT DOCUMENTS 5,075,739 A  *  12/1991  Davies  ................ H01L 29/0619
                                                              257/170
5,438,005 A  *   8/1995  Jang  .................... H01L 27/0921
                                                           148/DIG. 82
(Continued)

FOREIGN PATENT DOCUMENTS

CN    101740567 A    6/2010
CN    102290433 A    12/2011
(Continued)

OTHER PUBLICATIONS

International Search Report and Written Opinion of PCT Application No. PCT/JP2018/006877, dated May 1, 2018, 09 pages of ISRWO.

*Primary Examiner* — Scott B Geyer
(74) *Attorney, Agent, or Firm* — Chip Law Group

(57) ABSTRACT

The present disclosure relates to a semiconductor device and an electronic apparatus that make it possible to provide a higher voltage resistance. An outer-peripheral structure region is provided in an n-type well on a surface of a semiconductor substrate, the outer-peripheral structure region being arranged to surround an outer periphery of a region in which a plurality of semiconductor elements is formed. Further, an anode is arranged in an innermost in the outer-peripheral structure region, and a plurality of guard rings is multiply arranged on an outside of the anode. Furthermore, a field plate covering the anode and a field plate covering a guard ring adjacent to the anode are formed to be electrically connected to each other so as to be combined. The present technology is applicable to, for example, various semiconductor devices.

8 Claims, 11 Drawing Sheets

(56) References Cited

U.S. PATENT DOCUMENTS

| | | | |
|---|---|---|---|
| 5,691,553 A | | 11/1997 | Mori et al. |
| 6,049,111 A | * | 4/2000 | Higuchi ................ H01L 21/765 |
| | | | 257/173 |
| 2003/0218220 A1 | | 11/2003 | Takahashi et al. |
| 2010/0118455 A1 | | 5/2010 | Kusunoki |
| 2012/0007223 A1 | | 1/2012 | Koenig |
| 2012/0205666 A1 | * | 8/2012 | Henning ............ H01L 29/0619 |
| | | | 257/77 |
| 2013/0277745 A1 | * | 10/2013 | Tsai .................... H01L 27/0259 |
| | | | 257/355 |
| 2015/0091126 A1 | | 4/2015 | Takahashi |
| 2015/0311285 A1 | * | 10/2015 | Momota ............. H01L 29/4238 |
| | | | 257/139 |
| 2017/0256503 A1 | | 9/2017 | Fujii |
| 2020/0259005 A1 | * | 8/2020 | Nagata ................ H01L 29/7396 |

FOREIGN PATENT DOCUMENTS

| | | |
|---|---|---|
| CN | 104518007 A | 4/2015 |
| CN | 107146813 A | 9/2017 |
| DE | 10302628 A1 | 12/2003 |
| DE | 102009032446 A1 | 5/2010 |
| DE | 102010024257 A1 | 12/2011 |
| DE | 102017200252 A1 | 9/2017 |
| EP | 0703627 A1 | 3/1996 |
| JP | 08-088346 A | 4/1996 |
| JP | 2003-174165 A | 6/2003 |
| JP | 2003-347547 A | 12/2003 |
| JP | 2010-118548 A | 5/2010 |
| JP | 2012-004566 A | 1/2012 |
| JP | 2015-070184 A | 4/2015 |
| JP | 2017-157670 A | 9/2017 |

\* cited by examiner

SEMICONDUCTOR DEVICE AND ELECTRONIC APPARATUS

CROSS REFERENCE TO RELATED APPLICATIONS

This application is a U.S. National Phase of International Patent Application No. PCT/JP2018/006877 filed on Feb. 26, 2018, which claims priority benefit of Japanese Patent Application No. JP 2017-044644 filed in the Japan Patent Office on Mar. 9, 2017. Each of the above-referenced applications is hereby incorporated herein by reference in its entirety.

TECHNICAL FIELD

The present disclosure relates to a semiconductor device and an electronic apparatus, and, in particular, to a semiconductor device and an electronic apparatus that make it possible to provide a higher voltage resistance.

BACKGROUND ART

Conventionally, in various semiconductor devices, a method is used that improves voltage resistance using guard rings provided to surround an outer periphery on the surface of a semiconductor substrate. In general, the voltage resistance provided using guard rings is determined by an electric field applied to an outermost guard ring. Thus, voltage resistance is improved, for example, by balancing a potential distribution with, for example, the width, the pitch, and the number of guard rings; by processing an end of a guard ring to reduce the intensity of an electric field at the end; and by separating the concentration of an electric field such that the electric field is applied to two portions, the surface and the bottom, using the longitudinal layout of impurities of a guard ring.

Further, the provision of a field plate to cover a guard ring makes it possible to reduce the intensity of an electric field in the vicinity of the surface of a semiconductor substrate. In other words, in a structure without a field plate, the electric field is concentrated in a connection portion of a p-n junction constituting a semiconductor element, whereas, a structure provided with a field plate can spread an electric field also on the surface of a semiconductor substrate, which results in being able to improve voltage resistance.

For example, Patent Literature 1 discloses a semiconductor device that can reduce the current density of an outer-peripheral voltage resistant portion in a corner portion during breakdown, by electrically connecting an innermost field plate and a field plate adjacent to the innermost field plate at the corner portion.

CITATION LIST

Patent Literature

Patent Literature 1: Japanese Patent Application Laid-open No. 2003-174165

DISCLOSURE OF INVENTION

Technical Problem

As described above, conventionally, the method that improves voltage resistance using guard rings, has been used. However, there is a need to further improve voltage resistance in response to various situations.

The present disclosure has been made in view of the above-described circumstances and it is an object thereof to provide a higher voltage resistance.

Solution to Problem

A semiconductor device according to an aspect of the present disclosure includes: a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed; a first element region arranged in an innermost in the outer-peripheral structure region, the first element region being a semiconductor layer obtained by forming a semiconductor layer of a second conductive type in an annular shape, the second conductive type being opposite to the first conductive type, the first element region being connected to a specified reference potential; a plurality of guard rings multiply arranged on an outside of the first element region in the outer-peripheral structure region, each of the plurality of guard rings being a highly doped semiconductor layer obtained by forming a semiconductor layer of the second conductive type in an annular shape; a second element region provided on an outside of the outer-peripheral structure region, the second element region being a highly doped semiconductor layer of the first conductive type, the second element region being connected to a specified gate potential; and metal wires respectively formed to cover the first element region and the plurality of guard rings, in which the metal wire covering the first element region and the metal wire covering the guard ring adjacent to at least the first element region are electrically connected to each other.

A semiconductor device according to an aspect of the present disclosure includes: a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed; a first element region arranged in an innermost in the outer-peripheral structure region, the first element region being a semiconductor layer obtained by forming a semiconductor layer of a second conductive type in an annular shape, the second conductive type being opposite to the first conductive type, the first element region being connected to a specified reference potential; a plurality of guard rings multiply arranged on an outside of the first element region in the outer-peripheral structure region, each of the plurality of guard rings being a highly doped semiconductor layer obtained by forming a semiconductor layer of the second conductive type in an annular shape; and a second element region provided on an outside of the outer-peripheral structure region, the second element region being a highly doped semiconductor layer of the first conductive type, the second element region being connected to a specified gate potential, in which the first element region and the guard ring adjacent to at least the first element region are electrically connected to each other.

An electronic apparatus according to an aspect of the present disclosure includes a semiconductor device including: a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed; a first element region arranged in an innermost in the outer-peripheral structure region, the first element region being a semiconductor layer obtained by forming a semiconductor layer of a second conductive type in an annular shape, the second conductive type being opposite to the first conductive type, the first element region being connected to a specified reference potential; a plurality of guard rings multiply arranged on an outside of the first element region in the outer-peripheral structure region, each of the plurality of guard rings being a highly doped semiconductor layer obtained by forming a semiconductor layer of the second conductive type in an annular shape; a second element region provided on an outside of the outer-peripheral structure region, the second element region being a highly doped semiconductor layer of the first conductive type, the second element region being connected to a specified gate potential; and metal wires respectively formed to cover the first element region and the plurality of guard rings, in which the metal wire covering the first element region and the metal wire covering the guard ring adjacent to at least the first element region are electrically connected to each other.

In an aspect of the present disclosure, an outer-peripheral structure region is provided in a region of a first conductive type on a surface of a semiconductor substrate, the outer-peripheral structure region being arranged to surround an outer periphery of a region in which a plurality of semiconductor elements is formed. Further, a first element region is arranged in an innermost in the outer-peripheral structure region, is a semiconductor layer obtained by forming a semiconductor layer of a second conductive type in an annular shape, the second conductive type being opposite to the first conductive type, and is connected to a specified reference potential. A plurality of guard rings is multiply arranged on an outside of the first element region in the outer-peripheral structure region, and each of the plurality of guard rings is a highly doped semiconductor layer obtained by forming a semiconductor layer of the second conductive type in an annular shape. A second element region is provided on an outside of the outer-peripheral structure region, is a highly doped semiconductor layer of the first conductive type, and is connected to a specified gate potential. Metal wires are respectively formed to cover the first element region and the plurality of guard rings. Further, the metal wire covering the first element region and the metal wire covering the guard ring adjacent to at least the first element region are electrically connected to each other. Alternatively, the metal wire covering the first element region and the metal wire covering the guard ring adjacent to at least the first element region are electrically connected without providing the metal wires.

Advantageous Effects of Invention

An aspect of the present disclosure makes it possible to provide a higher voltage resistance.

MODE(S) FOR CARRYING OUT THE INVENTION

Specific embodiments using the present technology will now be described in detail with reference to the drawings.

Configuration Example of Semiconductor Device

Figure 1:
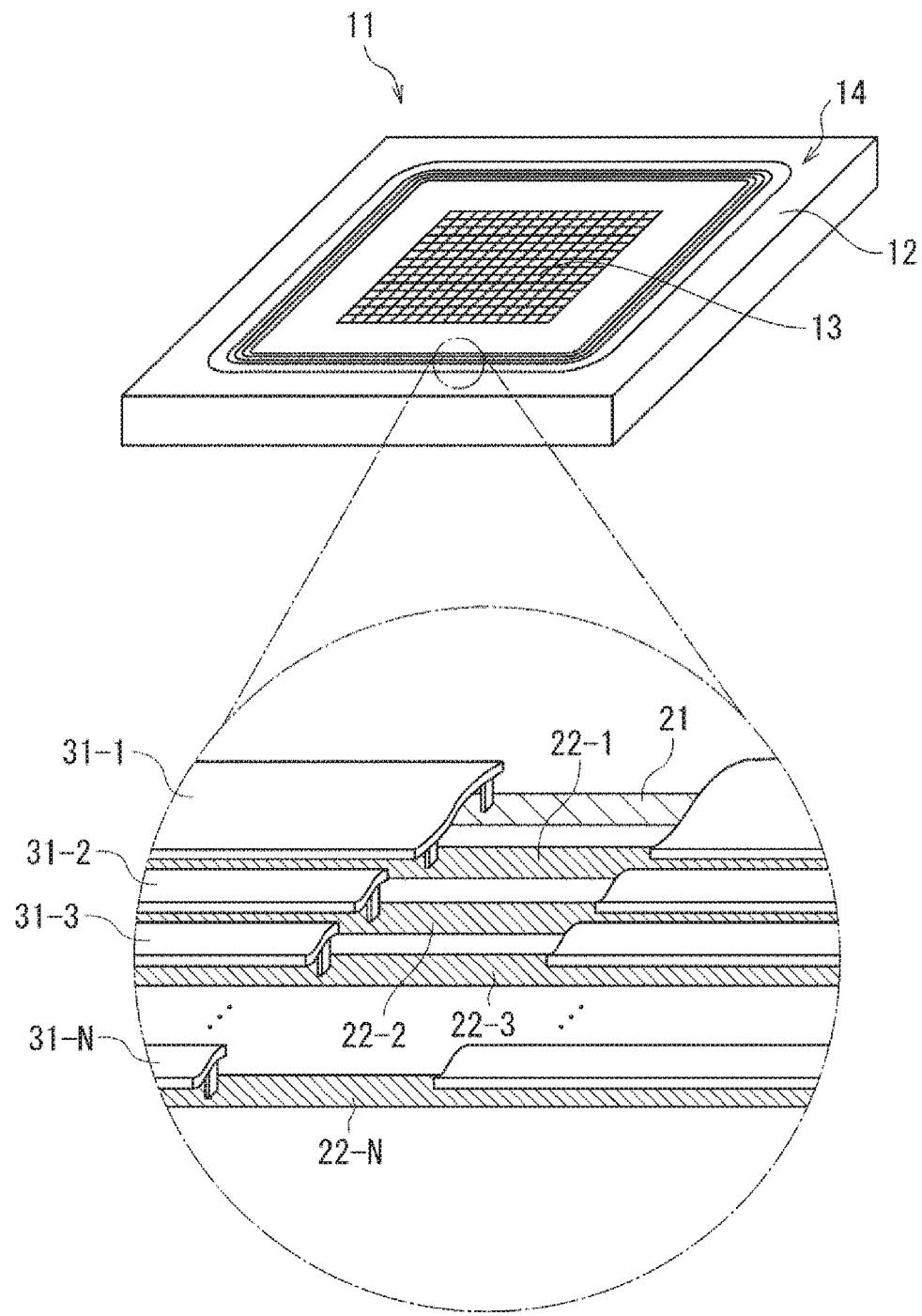
FIG. 1 illustrates a configuration example of an embodiment of a semiconductor device using the present technology.

FIG. 1 illustrates a configuration example of an embodiment of a semiconductor device using the present technology.

FIG. 1 has, in its upper portion, a perspective view illustrating a schematic configuration of the entirety of a semiconductor device 11, and has, in its lower portion, an enlarged view of a portion of the semiconductor device 11.

The semiconductor device 11 illustrated in FIG. 1 includes, on the surface of a semiconductor substrate 12, an element forming region 13 in which a plurality of semiconductor elements is formed, and includes, on the surface of the semiconductor substrate 12, an outer-peripheral structure region 14 arranged to surround the outer periphery of the element-forming region 13.

The semiconductor substrate 12 is, for example, a wafer formed by thinly sliced a single-crystal silicon.

The element forming region 13 is a region in which various semiconductor elements (for example, a transistor and a diode) for executing functions of the semiconductor device 11.

The outer-peripheral structure region 14 is a region in which a structure is formed that provides an outer peripheral portion of the element forming region 13 with a high voltage resistance, in order to prevent the occurrence of breakdown due to a high voltage being applied to the semiconductor device 11. For example, the outer-peripheral structure region 14 is provided in an n-type well formed on the surface of the semiconductor substrate 12, and as illustrated in the lower portion of FIG. 1, the outer-peripheral structure region 14 is configured by forming an anode 21, guard rings 22-1 to 22-N, and field plates 31-1 to 31-N.

The anode 21 is arranged in the innermost in the outer-peripheral structure region 14, is a p-type semiconductor layer formed in an annular shape, and is connected to a specified reference potential (GND).

The guard rings 22-1 to 22-N are multiply arranged on the outside of the anode 21 in the outer-peripheral structure region 14, and are highly doped p-type semiconductor layers formed in an annular shape.

The field plates 31-1 to 31-N are gate metal wires each formed to cover the anode 21 and the guard rings 22-1 to 22-N.

Here, the field plate 31-1 is arranged in the innermost in the outer-peripheral structure region 14, is formed to cover the anode 21 and the guard ring 22-1 adjacent to the anode 21, and is connected to both the anode 21 and the guard ring 22-1. Further, the field plate 31-2 is arranged on the outside of the field plate 31-1, is formed to cover the guard ring 22-2, and is connected to the guard ring 22-2. Likewise, the field plates 31-3 to 31-N are arranged toward the outside in this order, are each formed to cover the guard rings 22-3 to 22-N, and are each connected to the guard rings 22-3 to 22-N.

As described above, the outer-peripheral structure region 14 of the semiconductor device 11 has a configuration in which the field plate 31-1 is provided to cover the anode 21 provided in the innermost in the outer-peripheral structure region 14, and the guard ring 22-1 provided adjacent to the anode 21. Such a configuration permits the semiconductor device 11 to alleviate the concentration of an electric field inside the outer-peripheral structure region 14, which results in being able to provide a higher voltage resistance than in the past.

First Configuration Example of Outer-Peripheral Structure Region

Figure 2:
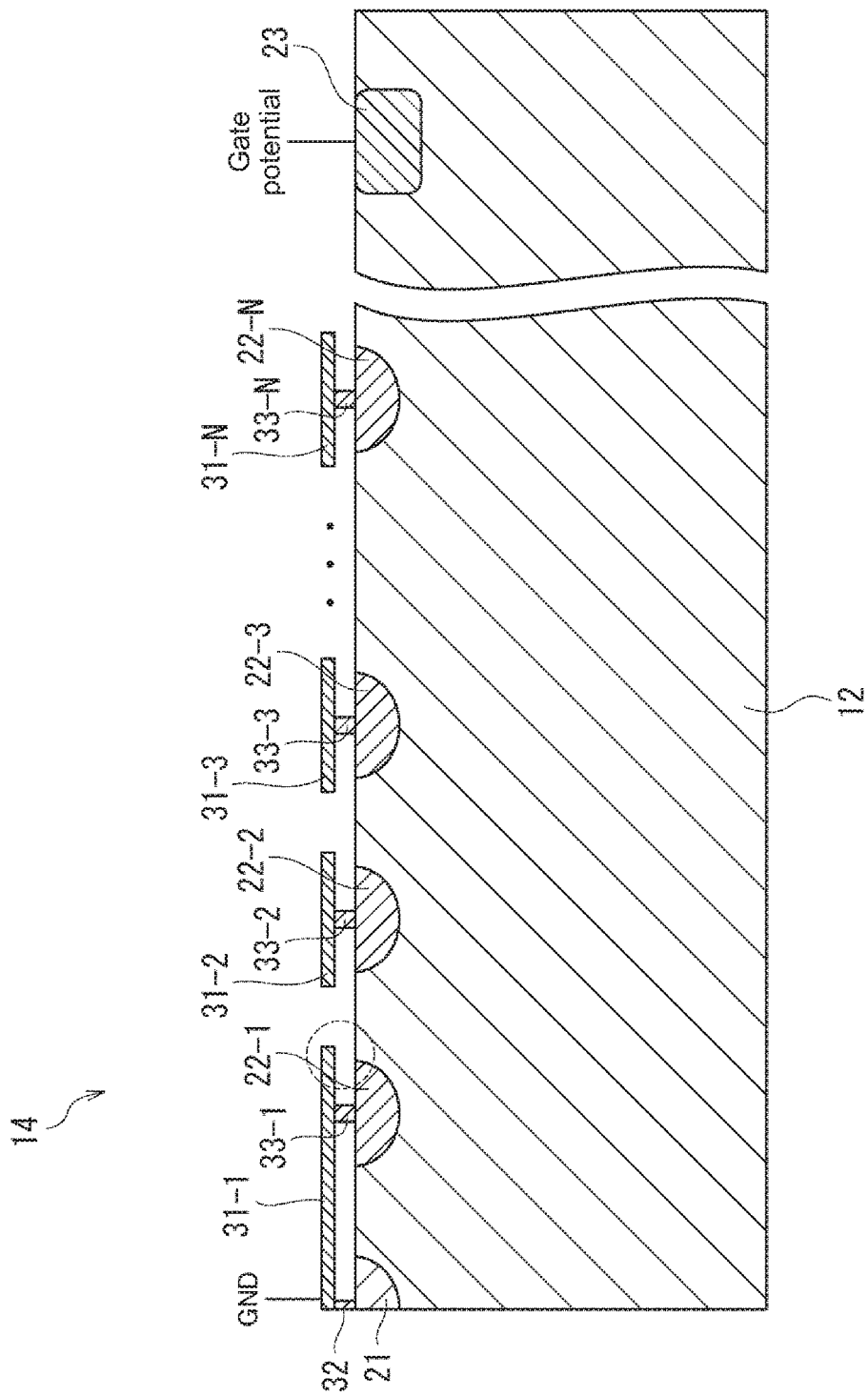
FIG. 2 is a cross-sectional view illustrating a first configuration example of an outer-peripheral structure region.

The structure of the outer-peripheral structure region 14 is further described with reference to a cross-sectional configuration example illustrated in FIG. 2. FIG. 2 illustrates the inside of the outer-peripheral structure region 14 on its left side, and the outside of the outer-peripheral structure region 14 on its right side.

As illustrated in FIG. 2, in the outer-peripheral structure region 14, a p-type semiconductor layer (element region) constituting the anode 21, and highly doped p-type semiconductor layers constituting the guard rings 22-1 to 22-N are formed on the surface of an n-type well of the semiconductor substrate 12. Further, a highly doped n-type semiconductor layer (element region) constituting a cathode 23 is formed on the surface of the n-type well of the semiconductor substrate 12 at an arbitrary position on the outside of the outer-peripheral structure region 14. The cathode 23 is connected to a specified gate potential.

Further, the field plate 31-1 arranged in the innermost from among the field plates 31-1 to 31-N, is formed to cover both the anode 21 and the guard ring 22-1, and is connected to a specified reference potential. Furthermore, an electrode 32 is formed to connect the field plate 31-1 and the anode 21, and an electrode 33-1 is formed to connect the field plate 31-1 and the guard ring 22-1. In other words, the anode 21 and guard ring 22-1 are connected to the specified reference potential through the field plate 31-1.

Further, as illustrated in a region represented in a doted circle in FIG. 2, an outer end of the field plate 31-1 (on the right side in FIG. 2) is formed to extend outwardly from the guard ring 22-1 by a specified width. This results in forming the field plate 31-1 to cover, by the specified width, a portion of the n-type well of the semiconductor substrate 12 on the outside of the guard ring 22-1.

Furthermore, the field plate 31-2 is formed to cover the guard ring 22-2, and an electrode 33-2 is formed to connect the field plate 31-2 and the guard ring 22-2. Likewise, the field plates 31-3 to 31-N are each formed to cover the guard rings 22-3 to 22-N toward the outside in this order, and electrodes 33-3 to 33-N are each formed to connect the field plates 31-3 to 31-N and the guard rings 22-3 to 22-N.

The outer-peripheral structure region 14 is configured as described above, in which the innermost field plate 31-1 is connected to a reference potential and a gate potential is applied to the cathode 23 provided on the outside of the outer-peripheral structure region 14. Here, it is possible to provide the semiconductor device 11 with a higher voltage resistance by alleviating, in the outer-peripheral structure region 14, the concentration of an electric field in the vicinity of the anode 21 and the guard ring 22-1 that are connected to the field plate 31-1.

Here, the potential and the distribution of an electric field intensity in the vicinity of the anode 21 and guard ring 22-1 in the outer-peripheral structure region 14, is described with reference to FIGS. 3A, 3B, 4, and 5.

Figure 3A:
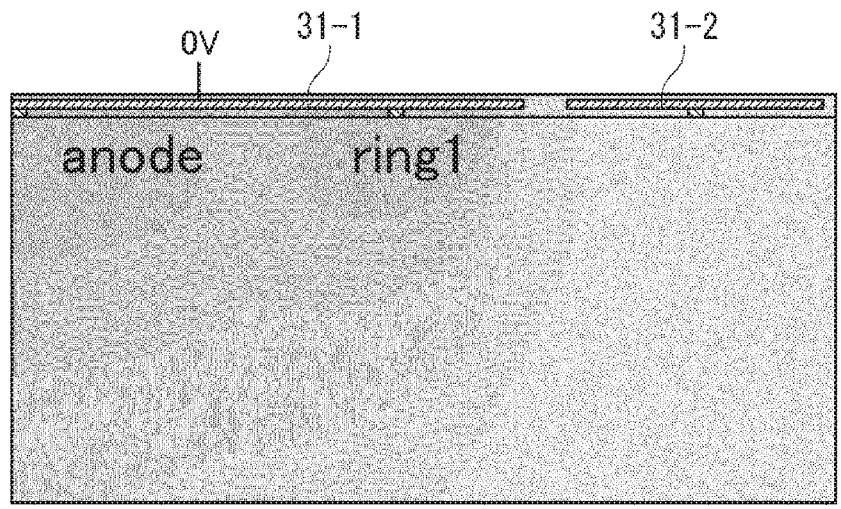
FIGS. 3A and 3B are diagrams describing a potential in the vicinity of an anode and a guard ring.
Figure 3B:
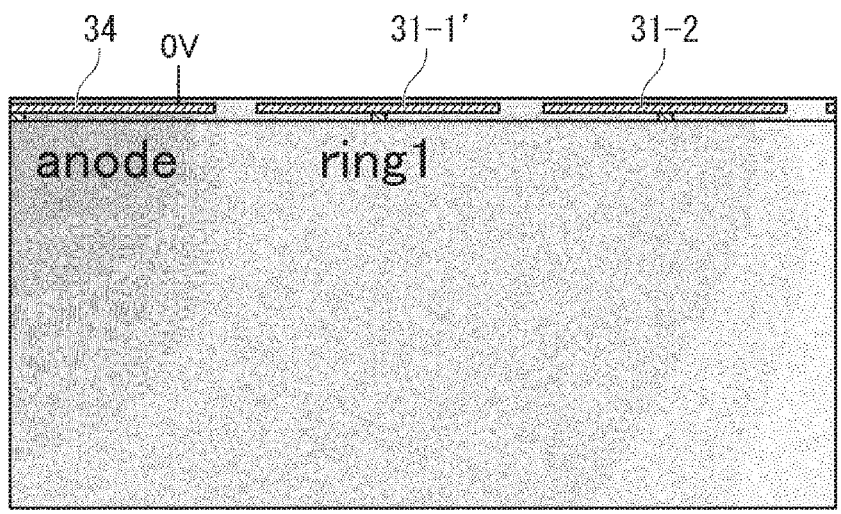

FIG. 3A illustrates a potential of the semiconductor substrate 12 in a configuration according to the embodiment, that is, a configuration in which the field plate 31-1 is formed to cover the anode 21 and the guard ring 22-1, as illustrated in FIG. 2. FIG. 3B illustrates a potential of the semiconductor substrate 12 in a conventional configuration, that is, a configuration in which a field plate 34 covering the anode 21 and a field plate 34-1' covering the guard ring 22-1 are separately formed. Further, in FIGS. 3A and 3B, the color becomes darker as the potential becomes deeper.

For example, as illustrated in FIG. 3B, the field plate 34 covering the anode 21 is connected to a reference potential (0V) in the conventional configuration, and the potential is deep only in the vicinity of the anode 21. On the other hand, as illustrated in FIG. 3A, the configuration in which the field plate 31-1 covering both the anode 21 and the guard ring 22-1 is connected to the reference potential (0V), can make the potential deep not only in the vicinity of the anode 21 but also in the vicinity of the guard ring 22-1.

Figure 4:
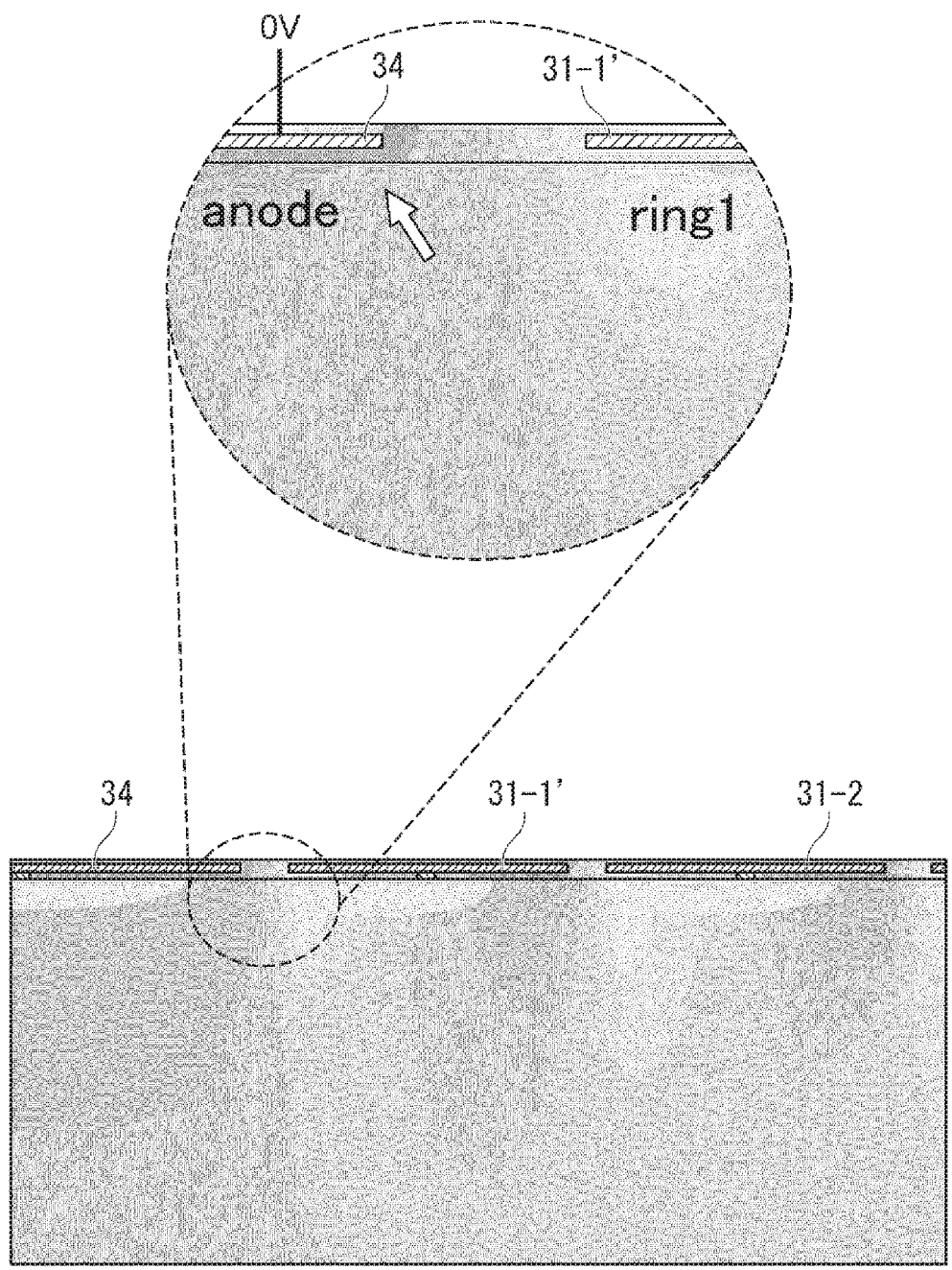
FIG. 4 is a diagram describing a distribution of an electric field intensity in the vicinity of an anode and a guard ring in a conventional configuration.

Further, FIG. 4 illustrates a distribution of an intensity of an electric field occurring in the semiconductor substrate 12 in the conventional configuration illustrated in FIG. 3B. As illustrated in FIG. 4, in a conventional structure, the intensity of an electric field is high only at an end of the field plate 34 covering the anode 21, that is, only on the side of the anode 21 between the anode 21 and the guard ring 22-1.

Figure 5:
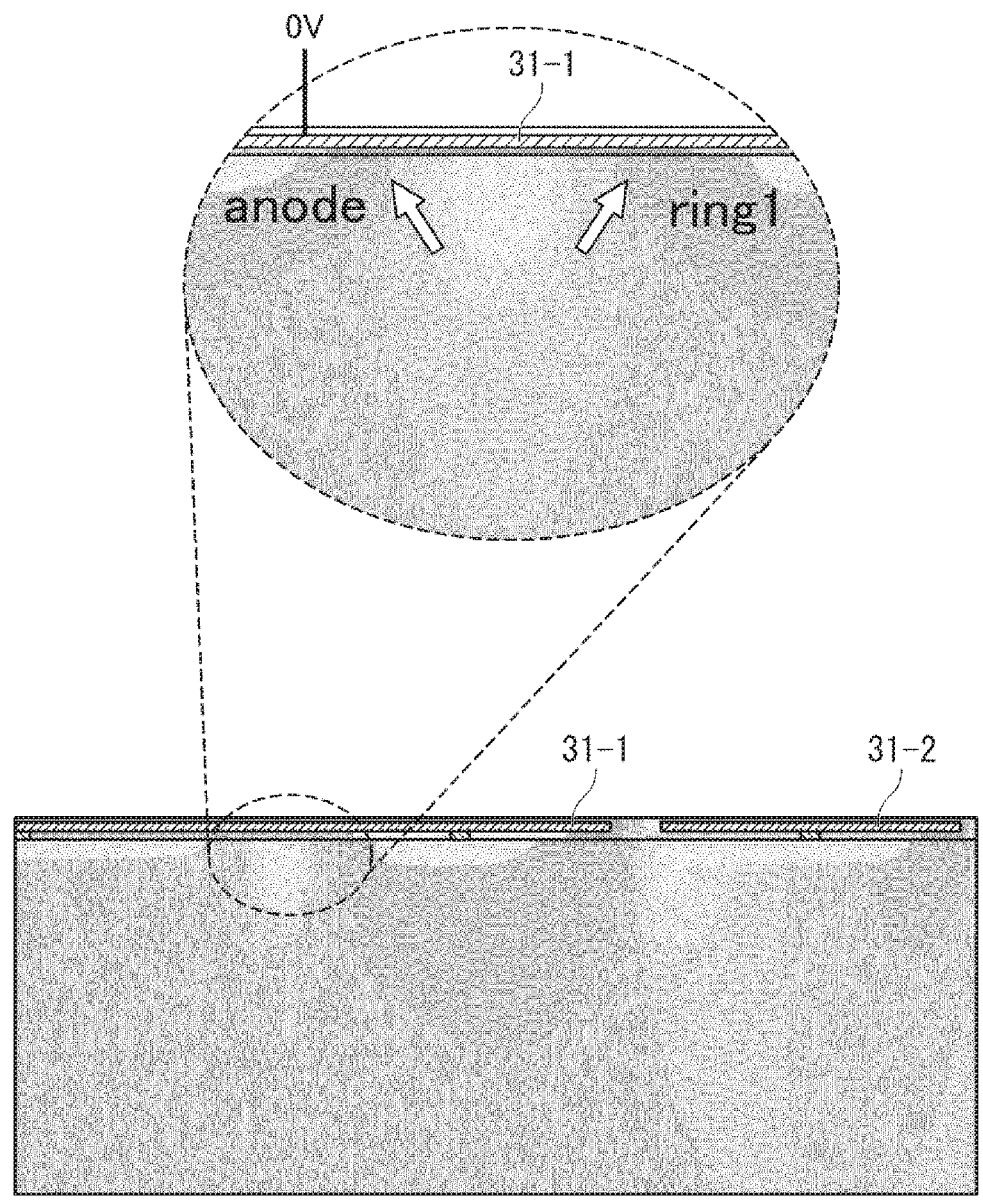
FIG. 5 is a diagram describing a distribution of an electric field intensity in the vicinity of an anode and a guard ring according to the embodiment.

On the other hand, FIG. 5 illustrates a distribution of an intensity of an electric field occurring in the semiconductor substrate 12 in the embodiment illustrated in FIG. 3A. As illustrated in FIG. 5, in a structure in which the field plate 31-1 is formed to cover the anode 21 and the guard ring 22-1, the intensity of an electric field is high both in the anode 21 and in the guard ring 22-1 between the anode 21 and the guard ring 22-1. In other words, compared with the distribution of an electric field intensity illustrated in FIG. 4, in the embodiment, the concentration of an electric field is distributed, and the intensity of an electric field is high not only on the side of anode 21 but also on the side of the guard ring 22-1.

Thus, it is possible to alleviate the concentration of an electric field by providing the field plate 34-1 having a configuration obtained by connecting the field plate 34 and the field plate 34-1' to combine (short circuit) them, not by providing the field plate 34 and the field plate 34-1' separately as is conventional. In other words, the concentration of an electric field is alleviated by forming the field plate 31-1 to cover the anode 21 and the guard ring 22-1, which results in being able to provide the semiconductor device 11 with a high voltage resistance.

In particular, the configuration in which the field plate 34-1 covering both the anode 21 and the guard ring 22-1 is provided, makes it possible to provide a high voltage resistance effectively with respect to the concentration of an electric field inside the outer-peripheral structure region 14.

Further, in the outer-peripheral structure region 14, an outer end of the field plate 31-1 is formed to extend outwardly from the guard ring 22-1 by a specified width. This results in the field plate 31-1 covering, by the specified width, a portion of the n-type well of the semiconductor substrate 12 on the outside of the guard ring 22-1, and thus it is possible to alleviate the electric field gradient in this portion of the specified width. Accordingly, it is possible to provide the semiconductor device 11 with a higher voltage resistance.

For example, in a state in which the surface of a guard ring is electrically charged due to a problem occurring when manufacturing the guard ring or due to a special use and further, impurities corresponding to this are introduced, no measures to reduce the intensity of an electric field in the innermost have been taken in the past. On the other hand, it is possible to increase voltage resistance in the semiconductor device 11 in response to the states described above by reducing the intensity of an electric field in the innermost.

Thus, regarding the semiconductor device 11 having a smaller area than a semiconductor device having a conventional configuration, it is possible to provide the semiconductor device 11 with a voltage resistance equal to or greater than the voltage resistance of the semiconductor device having a conventional configuration. This results in being able to downsize the entire semiconductor device 11 including the outer-peripheral structure region 14.

Second Configuration Example of Outer-Peripheral Structure Region

Figure 6:
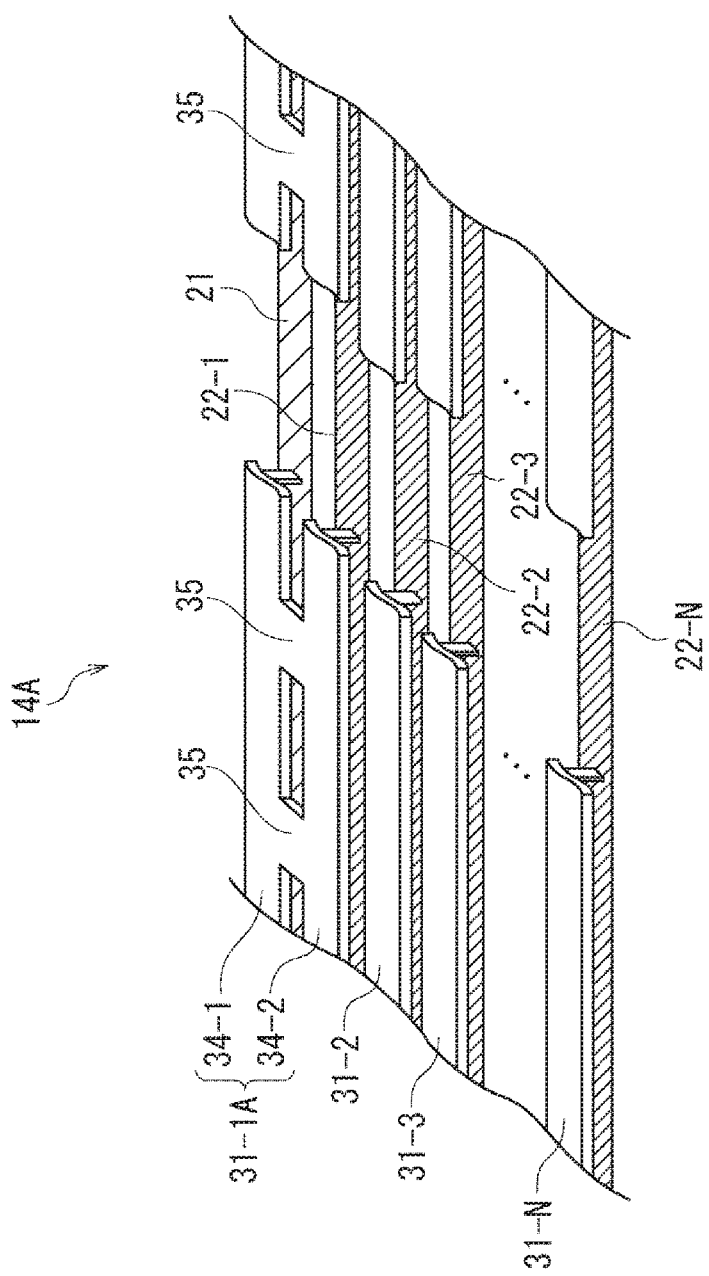
FIG. 6 is a cross-sectional view illustrating a second configuration example of the outer-peripheral structure region.

FIG. 6 illustrates a second configuration example of the outer-peripheral structure region 14. Note that, regarding a configuration that an outer-peripheral structure region 14A illustrated in FIG. 6 has in common with the outer-peripheral structure region 14 of FIG. 1, such a configuration in common is denoted by the same reference symbol and a detailed description thereof is omitted.

A field plate 31-1A arranged in the innermost in the outer-peripheral structure region 14A illustrated in FIG. 6, is configured by partially coupling, using a coupling plate 35, a field plate 34-1 covering the anode 21 to a field plate 34-2 covering the guard ring 22-1.

Specifically, the field plate 31-1 of FIG. 1 is formed such that a portion covering the anode 21 and a portion covering the guard ring 22-1 are combined over an entire periphery of the outer-peripheral structure region 14. On the other hand, the field plate 31-1A is obtained by partially coupling the field plate 34-1 to the field plate 34-2 in an identical layer using the coupling plate 35.

Such a configuration makes it possible to alleviate the concentration of an electric field inside the outer-peripheral structure region 14A, as in the case of the outer-peripheral structure region 14 of FIG. 1. This results in being able to provide the semiconductor device 11 with a high voltage resistance.

Third Configuration Example of Outer-Peripheral Structure Region

Figure 7:
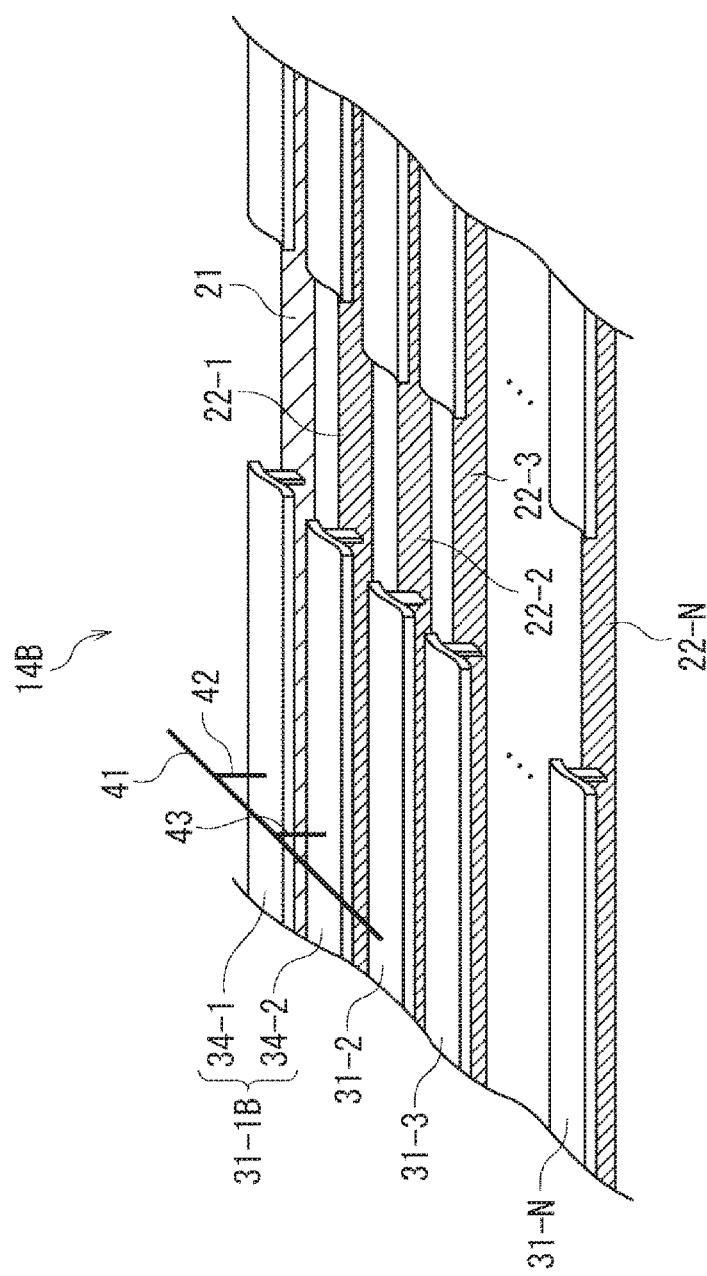
FIG. 7 is a cross-sectional view illustrating a third configuration example of the outer-peripheral structure region.

FIG. 7 illustrates a third configuration example of the outer-peripheral structure region 14. Note that, regarding a configuration that an outer-peripheral structure region 14B illustrated in FIG. 7 has in common with the outer-peripheral structure region 14 of FIG. 1, such a configuration in common is denoted by the same reference symbol and a detailed description thereof is omitted.

A field plate 31-1B arranged in the innermost in the outer-peripheral structure region 14B illustrated in FIG. 7, is configured by electrically connecting, through a wire 41 in a different layer, the field plate 34-1 covering the anode 21 to the field plate 34-2 covering the guard ring 22-1. In other words, the wire 41 is provided in a layer different from a layer in which the field plate 31-1B is formed, the field plate 34-1 is connected to the wire 41 through an electrode 42, and the field plate 34-2 is connected to the wire 41 through an electrode 43.

Such a configuration makes it possible to alleviate the concentration of an electric field inside the outer-peripheral structure region 14B, as in the case of the outer-peripheral structure region 14 of FIG. 1. This results in being able to provide the semiconductor device 11 with a high voltage resistance.

Fourth Configuration Example of Outer-Peripheral Structure Region

Figure 8:
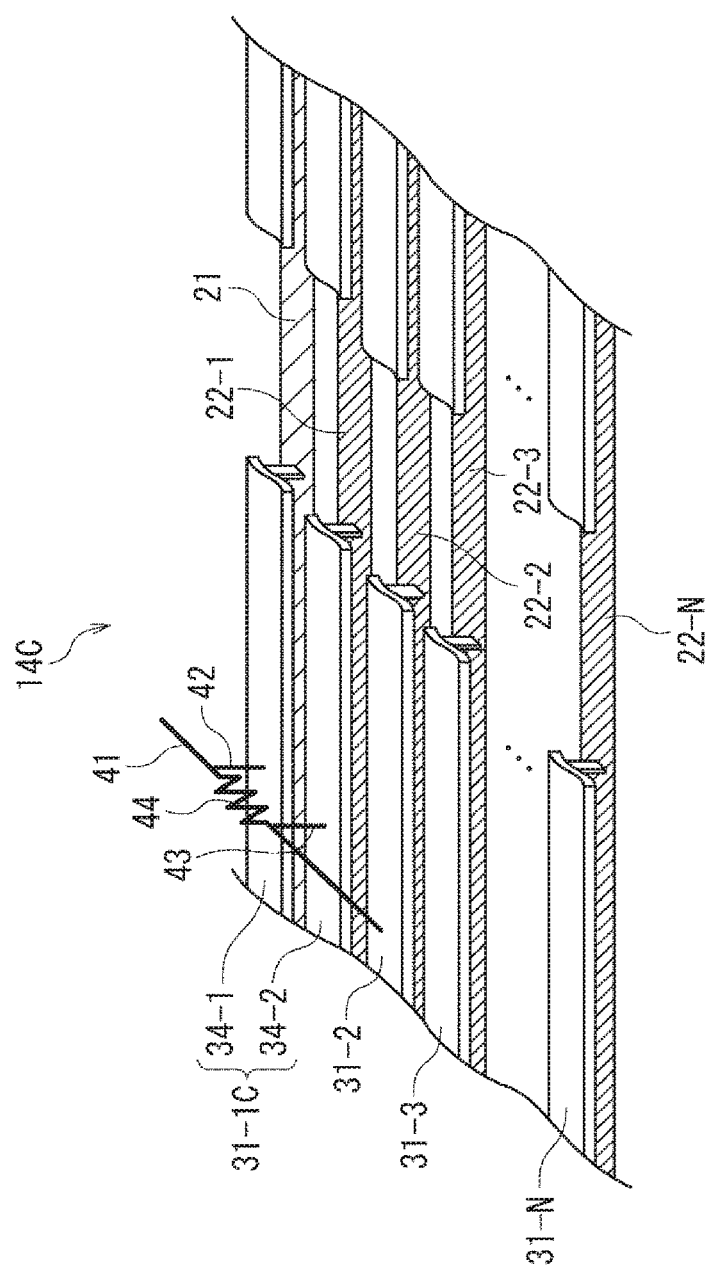
FIG. 8 is a cross-sectional view illustrating a fourth configuration example of the outer-peripheral structure region.

FIG. 8 illustrates a fourth configuration example of the outer-peripheral structure region 14. Note that, regarding a configuration that an outer-peripheral structure region 14C illustrated in FIG. 8 has in common with the outer-peripheral structure region 14B of FIG. 7, such a configuration in common is denoted by the same reference symbol and a detailed description thereof is omitted.

A field plate 31-1C arranged in the innermost in the outer-peripheral structure region 14C illustrated in FIG. 8, is configured by electrically connecting, through a resistance 44 arranged in a different layer, the field plate 34-1 covering the anode 21 to the field plate 34-2 covering the guard ring 22-1. In other words, the resistance 44 is connected to the wire 41 provided in a layer different from a layer in which the field plate 31-1B is formed, and the electrode 42 connected to the field plate 34-1 and the electrode 43 connected to the field plate 34-2 are respectively connected to a corresponding one of the two ends of the resistance 44.

Such a configuration makes it possible to alleviate the concentration of an electric field inside the outer-peripheral structure region 14C, as in the case of the outer-peripheral structure region 14 of FIG. 1. This results in being able to provide the semiconductor device 11 with a high voltage resistance.

Further, the configuration in which the field plate 34-1 and the field plate 34-2 are connected to each other through the resistance 44 permits the field plate 34-1C to adjust the ratio between the electric field intensity concentrated in an end of the anode 21 and the electric field intensity concentrated in an end of the guard ring 22-1. Accordingly, compared to a configuration in which the electric field intensity is high at one of the ends, it is possible to provide a higher voltage resistance, for example, by setting the resistance value of the resistance 44 such that the electric field intensity is equally concentrated in both of the ends.

Fifth Configuration Example of Outer-Peripheral Structure Region

Figure 9:
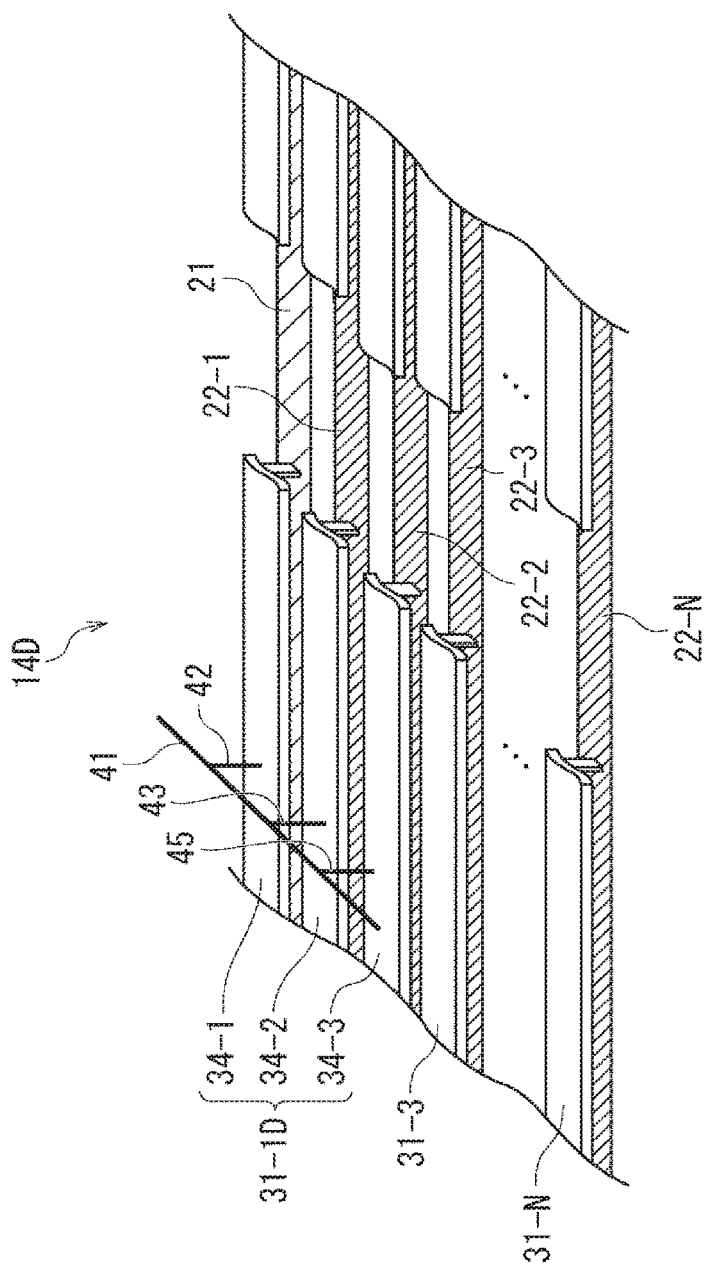
FIG. 9 is a cross-sectional view illustrating a fifth configuration example of the outer-peripheral structure region.

FIG. 9 illustrates a fifth configuration example of the outer-peripheral structure region 14. Note that, regarding a configuration that an outer-peripheral structure region 14D illustrated in FIG. 9 has in common with the outer-peripheral structure region 14B of FIG. 7, such a configuration in common is denoted by the same reference symbol and a detailed description thereof is omitted.

A field plate 31-1D arranged in the innermost in the outer-peripheral structure region 14D illustrated in FIG. 9, is configured by electrically connecting, through the wire 41 in a different layer, the field plate 34-1 covering the anode 21, the field plate 34-2 covering the guard ring 22-1, and a field plate 34-3 covering the guard ring 22-2 to one another. In other words, the wire 41 is provided in a layer different from a layer in which the field plate 31-1D is formed, and the field plates 34-1 to 34-3 are respectively connected to the wire 41 through the electrode 42, the electrode 43, and an electrode 45.

Such a configuration makes it possible to alleviate the concentration of an electric field inside the outer-peripheral structure region 14D, as in the case of the outer-peripheral structure region 14 of FIG. 1. This results in being able to provide the semiconductor device 11 with a high voltage resistance. Moreover, the voltage resistance of the semiconductor device 11 can be further improved by appropriately setting the number of field plates 34 to be connected.

Note that the number of field plates 34 to be connected is not limited to two and three described above, and three or more field plates 34 from the inside of the outer-peripheral structure region 14 may be connected to one another. Further, regarding the connection of a plural number of field plates 34, in addition to the connection using the wire 41 in a different layer, the connection may be made such that the plural number of field plates 34 are combined over an entire periphery of the outer-peripheral structure region 14, as illustrated in FIG. 1, and the plural number of field plates 34 may be partially coupled to one another using the coupling plate 35, as illustrated in FIG. 6.

Sixth Configuration Example of Outer-Peripheral Structure Region

Figure 10:
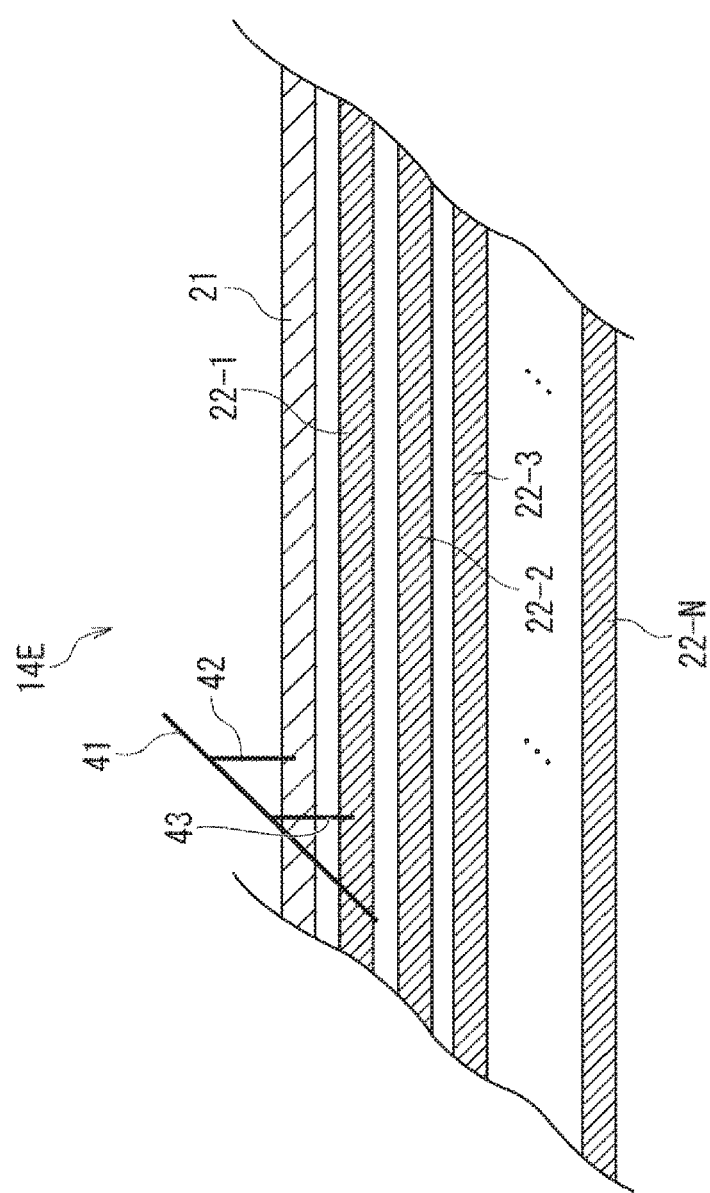
FIG. 10 is a cross-sectional view illustrating a sixth configuration example of the outer-peripheral structure region.

FIG. 10 illustrates a sixth configuration example of the outer-peripheral structure region 14. Note that, regarding a configuration that an outer-peripheral structure region 14E illustrated in FIG. 6 has in common with the outer-peripheral structure region 14 of FIG. 1, such a configuration in common is denoted by the same reference symbol and a detailed description thereof is omitted.

As illustrated in FIG. 10, the outer-peripheral structure region 14E is configured such that the anode 21 and the guard ring 22-1 are electrically connected to each other through the wire 41 without providing the field plate 31 described above.

As described above, it is also possible to alleviate the concentration of an electric field inside the outer-peripheral structure region 14E by electrically connecting the anode 21 and the guard ring 22-1. This makes it possible to provide the semiconductor device 11 with a higher voltage resistance.

Note that the present technology is applicable to various semiconductor devices such as a memory, a microprocessor, and a system LSI (Large-Scale Integration) that are constituted of a plurality of semiconductor elements. In other words, the present technology is applicable to a semiconductor device having a configuration in which the outer-peripheral structure region 14 having the configuration described above is provided on the surface of the semiconductor substrate 12 such that the outer-peripheral structure region 14 surrounds the outside of a region in which a plurality of semiconductor elements is formed. This makes it possible to provide various types of semiconductor devices with a high voltage resistance, which results in being able to downsize a semiconductor device including the outer-peripheral structure region 14.

Configuration Example of Electronic Apparatus

For example, the semiconductor device 11 described above is applicable to a solid-state imaging element provided with the outer-peripheral structure region 14 such that the outer-peripheral structure region 14 surrounds a pixel array region in which pixels are arranged in an array. The solid-state imaging element can be incorporated into various electronic apparatuses such as a cellular phone having an imaging system or an imaging function such as a digital still camera or a digital video camera; and other apparatuses having an imaging function.

Figure 11:
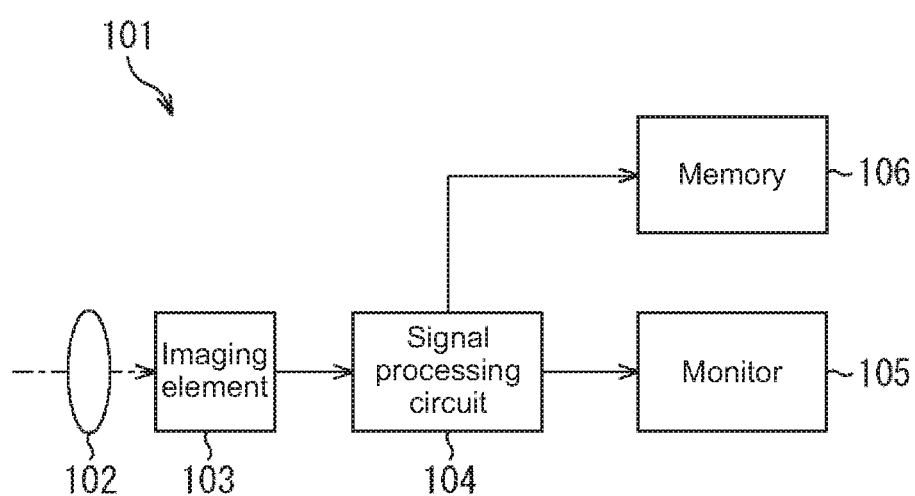
FIG. 11 is a block diagram illustrating a configuration example of an electronic apparatus.

FIG. 11 is a block diagram illustrating a configuration example of an electronic apparatus.

As illustrated in FIG. 11, an electronic apparatus 101 includes an optical system 102, an imaging element 103, a signal processing circuit 104, a monitor 105, and a memory 106, and it is possible to capture a still image and a moving image using the electronic apparatus 101.

The optical system 102 has one or more lenses. The optical system 102 guides an image light (incident light) from an object to the imaging element 103, and forms an image on a light-receiving surface (sensor) of the imaging element 103.

The semiconductor device 11 described above is applied as the imaging element 103. Electrons are accumulated in the imaging element 103 for a specified period of time according to an image formed on the light-receiving surface through the optical system 102. Then, a signal according to the electron accumulated in the imaging element 103 is provided to the signal processing circuit 104.

The signal processing circuit 104 performs various signal processing on a pixel signal output from the imaging element 103. An image (image data) obtained by the signal processing circuit 104 performing signal processing, is provided on the monitor 105 to be displayed or is provided to the memory 106 to be stored (recorded).

It is possible to, for example, further downsize the electronic apparatus 101 having such a configuration, using the semiconductor device 11 described above.

Example of Combination of Configuration

Note that the present technology may also take the following configurations.
(1) A semiconductor device including:
a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed;
a first element region arranged in an innermost in the outer-peripheral structure region, the first element region being a semiconductor layer obtained by forming a semiconductor layer of a second conductive type in an annular shape, the second conductive type being opposite to the first conductive type, the first element region being connected to a specified reference potential;
a plurality of guard rings multiply arranged on an outside of the first element region in the outer-peripheral structure region, each of the plurality of guard rings being a highly doped semiconductor layer obtained by forming a semiconductor layer of the second conductive type in an annular shape;

a second element region provided on an outside of the outer-peripheral structure region, the second element region being a highly doped semiconductor layer of the first conductive type, the second element region being connected to a specified gate potential; and metal wires respectively formed to cover the first element region and the plurality of guard rings, in which the metal wire covering the first element region and the metal wire covering the guard ring adjacent to at least the first element region are electrically connected to each other.

(2) The semiconductor device according to (1), in which the metal wire is formed to extend outwardly by a specified width from an end of the guard ring adjacent to the first element region, and to cover a portion of the semiconductor substrate of the first conductive type, the portion being situated on an outside of the guard ring adjacent to the first element region.

(3) The semiconductor device according to (1) or (2), in which the metal wire covering the first element region and the metal wire covering at least the guard ring adjacent to the first element region are formed to be combined over an entire periphery of the outer-peripheral structure region in a layer identical to a layer of the metal wires.

(4) The semiconductor device according to (1) or (2), in which the metal wire covering the first element region and the metal wire covering at least the guard ring adjacent to the first element region are partially coupled to each other in a layer identical to a layer of the metal wires.

(5) The semiconductor device according to (1) or (2), in which the metal wire covering the first element region and the metal wire covering at least the guard ring adjacent to the first element region are electrically connected to each other through a wire provided in a layer different from a layer of the metal wires.

(6) The semiconductor device according to (1) or (2), in which the metal wire covering the first element region and the metal wire covering at least the guard ring adjacent to the first element region are electrically connected to each other through a resistance provided in a layer different from a layer of the metal wires.

(7) A semiconductor device including:

a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed;

a first element region arranged in an innermost in the outer-peripheral structure region, the first element region being a semiconductor layer obtained by forming a semiconductor layer of a second conductive type in an annular shape, the second conductive type being opposite to the first conductive type, the first element region being connected to a specified reference potential;

a plurality of guard rings multiply arranged on an outside of the first element region in the outer-peripheral structure region, each of the plurality of guard rings being a highly doped semiconductor layer obtained by forming a semiconductor layer of the second conductive type in an annular shape; and a second element region provided on an outside of the outer-peripheral structure region, the second element region being a highly doped semiconductor layer of the first conductive type, the second element region being connected to a specified gate potential, in which the first element region and the guard ring adjacent to at least the first element region are electrically connected to each other.

(8) An electronic apparatus that includes a semiconductor device including:

a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed;

a first element region arranged in an innermost in the outer-peripheral structure region, the first element region being a semiconductor layer obtained by forming a semiconductor layer of a second conductive type in an annular shape, the second conductive type being opposite to the first conductive type, the first element region being connected to a specified reference potential;

a plurality of guard rings multiply arranged on an outside of the first element region in the outer-peripheral structure region, each of the plurality of guard rings being a highly doped semiconductor layer obtained by forming a semiconductor layer of the second conductive type in an annular shape;

a second element region provided on an outside of the outer-peripheral structure region, the second element region being a highly doped semiconductor layer of the first conductive type, the second element region being connected to a specified gate potential; and metal wires respectively formed to cover the first element region and the plurality of guard rings, in which the metal wire covering the first element region and the metal wire covering the guard ring adjacent to at least the first element region are electrically connected to each other.

Although the embodiment is not limited to the examples described above and various modifications may be made without departing from the gist of the present disclosure.

REFERENCE SIGNS LIST 11 semiconductor device
12 semiconductor substrate
13 element forming region
14 outer-peripheral structure region
21 anode
22 guard ring
23 cathode
31 field plate
32,33 electrode
34 field plate
35 coupling plate
41 wire
42,43 electrode
44 resistance
45 electrode

The invention claimed is:

1. A semiconductor device, comprising:
   a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed;
a first element region arranged in an innermost in the outer-peripheral structure region, the first element region being a semiconductor layer obtained by formation of a first semiconductor layer of a second conductive type in an annular shape, the second conductive type being opposite to the first conductive type, the first element region being connected to a specified reference potential;
a plurality of guard rings multiply arranged on an outside of the first element region in the outer-peripheral structure region, each of the plurality of guard rings being a highly doped semiconductor layer obtained by formation of a second semiconductor layer of the second conductive type in the annular shape;
a second element region provided on an outside of the outer-peripheral structure region, the second element region being a highly doped semiconductor layer of the first conductive type, the second element region being connected to a specified gate potential; and
metal wires respectively formed to cover the first element region and the plurality of guard rings, wherein
a first metal wire of the metal wires covering the first element region and a second metal wire of the metal wires covering a guard ring of the plurality of guard rings adjacent to at least the first element region are electrically connected to each other.

2. The semiconductor device according to claim 1, wherein
the second metal wire is formed to extend outwardly by a specified width from an end of the guard ring adjacent to the first element region, and to cover a portion of the semiconductor substrate of the first conductive type, the portion being situated on an outside of the guard ring adjacent to the first element region.

3. The semiconductor device according to claim 1, wherein
the first metal wire covering the first element region and the second metal wire covering at least the guard ring adjacent to the first element region are formed to be combined over an entire periphery of the outer-peripheral structure region in a layer identical to a layer of the metal wires.

4. The semiconductor device according to claim 1, wherein
the first metal wire covering the first element region and the second metal wire covering at least the guard ring adjacent to the first element region are partially coupled to each other in a layer identical to a layer of the metal wires.

5. The semiconductor device according to claim 1, wherein
the first metal wire covering the first element region and the second metal wire covering at least the guard ring adjacent to the first element region are electrically connected to each other through a wire provided in a layer different from a layer of the metal wires.

6. The semiconductor device according to claim 1, wherein
the first metal wire covering the first element region and the second metal wire covering at least the guard ring adjacent to the first element region are electrically connected to each other through a resistance provided in a layer different from a layer of the metal wires.

7. A semiconductor device comprising:
a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed;
a first element region arranged in an innermost in the outer-peripheral structure region, the first element region being a semiconductor layer obtained by formation of a first semiconductor layer of a second conductive type in an annular shape, the second conductive type being opposite to the first conductive type, the first element region being connected to a specified reference potential;
a plurality of guard rings multiply arranged on an outside of the first element region in the outer-peripheral structure region, each of the plurality of guard rings being a highly doped semiconductor layer obtained by formation of a second semiconductor layer of the second conductive type in the annular shape; and
a second element region provided on an outside of the outer-peripheral structure region, the second element region being a highly doped semiconductor layer of the first conductive type, the second element region being connected to a specified gate potential, wherein
the first element region and a guard ring of the plurality of guard rings adjacent to at least the first element region are electrically connected to each other.

8. An electronic apparatus, comprising: a semiconductor device that comprises:
a semiconductor substrate provided with an outer-peripheral structure region in a region of a first conductive type on a surface of the semiconductor substrate, the outer-peripheral structure region being arranged to surround an outer periphery of a region in which a plurality of semiconductor elements is formed;
a first element region arranged in an innermost in the outer-peripheral structure region, the first element region being a semiconductor layer obtained by formation of a first semiconductor layer of a second conductive type in an annular shape, the second conductive type being opposite to the first conductive type, the first element region being connected to a specified reference potential;
a plurality of guard rings multiply arranged on an outside of the first element region in the outer-peripheral structure region, each of the plurality of guard rings being a highly doped semiconductor layer obtained by formation of a second semiconductor layer of the second conductive type in the annular shape;
a second element region provided on an outside of the outer-peripheral structure region, the second element region being a highly doped semiconductor layer of the first conductive type, the second element region being connected to a specified gate potential; and
metal wires respectively formed to cover the first element region and the plurality of guard rings, wherein
a first metal wire of the metal wires covering the first element region and a second metal wire of the metal wires covering a guard ring of the plurality of guard rings adjacent to at least the first element region are electrically connected to each other.

* * * * *